United States Patent [19]

Whitehead et al.

[11] Patent Number: 4,989,051
[45] Date of Patent: Jan. 29, 1991

[54] BI-DIRECTIONAL, FEED THROUGH EMITTER-DETECTOR FOR OPTICAL FIBER TRANSMISSION LINES

[75] Inventors: Thomas W. Whitehead, Raleigh, N.C.; Robert G. Hunsperger, Newark; Garfield Simms, Dover, both of Del.

[73] Assignee: The Univ. of Delaware, Newark; E. I. DuPont de Nemours & Co., Wilmington; both of Del.

[21] Appl. No.: 479,258

[22] Filed: Feb. 13, 1990

[51] Int. Cl.$^5$ .............................................. H01L 31/12
[52] U.S. Cl. ...................................... 357/19; 357/17; 372/44; 372/45; 372/50; 250/227.24; 250/551; 350/96.15; 350/96.17
[58] Field of Search ............... 357/19, 17, 16; 372/43, 372/45, 108, 44, 46, 50; 350/96.15, 96.17; 250/227.24, 551

[56] References Cited

U.S. PATENT DOCUMENTS

| 4,644,379 | 2/1987 | Hidman et al. | 372/45 |
| 4,773,074 | 9/1988 | Hunsperger et al. | 372/50 |
| 4,948,960 | 8/1990 | Simms et al. | 357/19 |

FOREIGN PATENT DOCUMENTS

| 54-48493 | 4/1979 | Japan | 357/17 |
| 56-6482 | 1/1981 | Japan | 357/19 |
| 56-43783 | 4/1981 | Japan | 357/17 |
| 60-3183 | 1/1985 | Japan | 372/46 |
| 60-9181 | 1/1985 | Japan | 357/17 L |
| 62-122285 | 6/1987 | Japan | 357/17 |

OTHER PUBLICATIONS

Copeland et al., "p-n-p-n Optical Detectors . . . Diodes", IEEE, vol. QE-14, No. 11, Nov. 1978.

Primary Examiner—Rolf Hille
Assistant Examiner—Minhloan T. Tran
Attorney, Agent, or Firm—Connolly and Hutz

[57] ABSTRACT

A unitary emitter-detector diode device for direct optical coupling to optical transmission lines as two surface oriental optical fibers on lateral surfaces of the device. The device has a p-n junction formed between a heavily doped semiconducting layer and a lightly doped semiconducting layer and means for guiding and concentrating the recombination of carriers within the diode. The feed through geometry permits transmitting in either direction from the device as well as detecting.

13 Claims, 3 Drawing Sheets

BI-DIRECTIONAL, FEED THROUGH EMITTER-DETECTOR FOR OPTICAL FIBER TRANSMISSION LINES

FIELD OF THE INVENTION

This invention relates to semiconductor diode devices for optical fiber transmissions in which the coupling of optical waveguides to a diode for light emission and detection is surface oriented. The diode functions as an emitter and a detector with respect to light transmission through optical waveguides, such as a pair of optical fibers each coupled to the diode at a surface parallel to the diode junction and positioned substantially normal to the parallel surfaces, optical fibers being positioned on opposite surfaces of the diode.

BACKGROUND

Radiation can be transmitted through optical waveguides, such as thin transparent fibers referred to as optical fibers. The semiconductor light emitting diode emits a stable source of radiation, referred to herein as light. Coupled light emitting diodes are used for introducing optical signals into an optical fiber and coupled photodiodes are used for detection of light signals to provide electrical signals at the receiving end.

In the emission mode of the diode, coupling refers to the reception in the optical fibers of light produced by the recombination of holes and electrons in the diode. In the detection mode, coupling refers to the absorption of photons received from the optical fiber which results in the production of electrical charge carriers. In gallium aluminum arsenide diodes, for example, a forward bias on the diode causes the injection of electrons from the n-type regions into the p-type regions; the electrons injected into the active p-type region of the diode recombine with holes present therein, giving up energy in the process to form photons of light.

In the detection mode the process in reverse produces electrons and holes from the photons.

The quantum efficiency of this conversion in the emission mode is determined by the ratio of photons in a given waveguide to the number of carriers converted to photons in the diode.

In the detection mode the quantum efficiency of the diode is defined as the ratio of the number of charge carriers produced at the electrical output to the number of photons entering the diode.

The system of U.S. Pat. No. 3,952,265 issued Apr. 20, 1976 to R. G. Hunsperger et al. provides a unitary dual mode diode which can function as an emitter or detector. Basically this dual mode diode is a p-n junction that functions as a laser when forward biased, a photodiode when reverse biased, and with no voltage applied when in the neutral state has a relatively low insertion loss which does not interfere with the functioning of other devices on the transmission line.

In the unitary emitter-receiver semiconductor diode device of U.S. Pat. No. 4,773,074 issued Sep. 20, 1988 the p-n junction is formed between a heavily doped active layer of one conductivity type and a lightly doped wave guiding layer of opposite conductivity type so as to improve the efficiency of both the emitter and receiver modes.

A dual mode emitting diode/detector diode for optical fiber transmission lines of copending U.S. application Ser. No. 07/247,042 filed Sep. 20, 1988 by Garfield Simms and R. G. Hunsperger provides direct coupling of an optical fiber to the diode at a lateral surface which is parallel to the p-n junction so that in the forward biased emitter mode the optical power from this lateral or parallel surface is substantially greater than the side-edge emission of the diode.

It is an object of this invention to provide a unitary emitter-detector semiconductor diode device with improved coupling efficiency.

Another object of this invention is an improvement in a unitary emitter-detector semiconductor diode device which reduces losses from a Lambertian emission pattern.

It is still another object of this invention to provide a unitary emitter-detector diode which can transmit in both directions from surfaces parallel to the p-n junction.

A further object is providing surface-oriented coupling to a unitary emitter-detector diode which has improved effectiveness with optical fibers or other waveguides.

A still further object is to provide a unitary emitter-detector semiconducting diode which in the quiescent or off mode will pass a signal through the diode between opposed fibers with low loss of signal.

These and other objects will be apparent from consideration of the following description with the accompanying drawings and claims.

SUMMARY OF THE INVENTION

In the embodiment of the present invention a bi-directional double-hetero light emitting diode is provided by directly coupling optical fibers at the lateral surfaces of the diode which are parallel to the p-n junction. The LED structure has at least four parallel layers consisting of thin, confining layers of opposite conductivity positioned outwardly of the p-n junction and each directly coupled to an optical fiber at the lateral or parallel surface of the diode, and an active p-type conductivity region and an n-type conductivity region forming the p-n junction. The active p-type region is provided with a greater doping concentration to improve efficiency of light emission, while the n-type region is lightly doped to improve efficiency of light detection. The purpose of the confining layers is to confine both photons and charge carriers (electrons and holes) to the active regions of the device. The structure is operable in two directions through the optical fibers.

The confining layers may be provided with heavily doped regions centrally of the diode at the optical fibers to increase the efficiency of light emission by directing electrical current flow to the central region.

To improve the transmission of photons to and from the diode, the outermost layers are formed with indentations, or wells at the lateral surfaces in which the fibers are positioned with the axis normal to the surface. The fiber is fixedly supported in the well by a suitable cement applied into and around the well, or other means.

This invention is particularly adaptable to light transmission through multimode fibers. Multimode optical fibers have a core diameter greater than 10 micrometers and preferably of the order of 50 micrometers core diameter, or greater.

In the surface-oriented diode of the present invention surface emission of light and surface reception of light is effected from either of the lateral surfaces of the diode. When the diode device is turned-off with no bias applied, in this quiescent mode, a light signal passes through the diode with low loss in transmission.

It will be understood that reference to a surface-oriented diode indicates the relative positioning of the diode elements and the optical waveguide, with the general arrangement of the elements forming the p-n junction being normal or perpendicular to the axis of the optical waveguide. The lateral surfaces of the diode referred to herein are surfaces of the diode elements positioned in relation to the waveguide in accordance with this general arrangement. Stated otherwise, the plane of the p-n junction is normal to the optical waveguide axis.

In this invention in the emission mode continuous or pulsed light is emitted from an active volume in the diode. The photon emission within the diode is concentrated to reduce the losses resulting from light emitted in a Lambertian pattern.

DESCRIPTIONS OF THE DRAWINGS

FIG. 1 schematically illustrates a layered structure embodiment of a diode directly coupled to two surface-oriented optical fibers;

DESCRIPTION

The following descriptions are incorporated by reference as background teaching and for structure and methods applicable to the instant invention:
U.S. Pat. No. 3,952,265 issued Apr. 20, 1976
U.S. Pat. No. 4,773,074 issued Sep. 20, 1988
U.S. Ser. No. 07/247,042 filed Sep. 20, 1988.

The present invention provides a bi-directional feed-through of an optical signal at an emitter-detector device in which the signal can be transmitted in either direction through optical fibers surface-oriented with the device.

Figure 1:
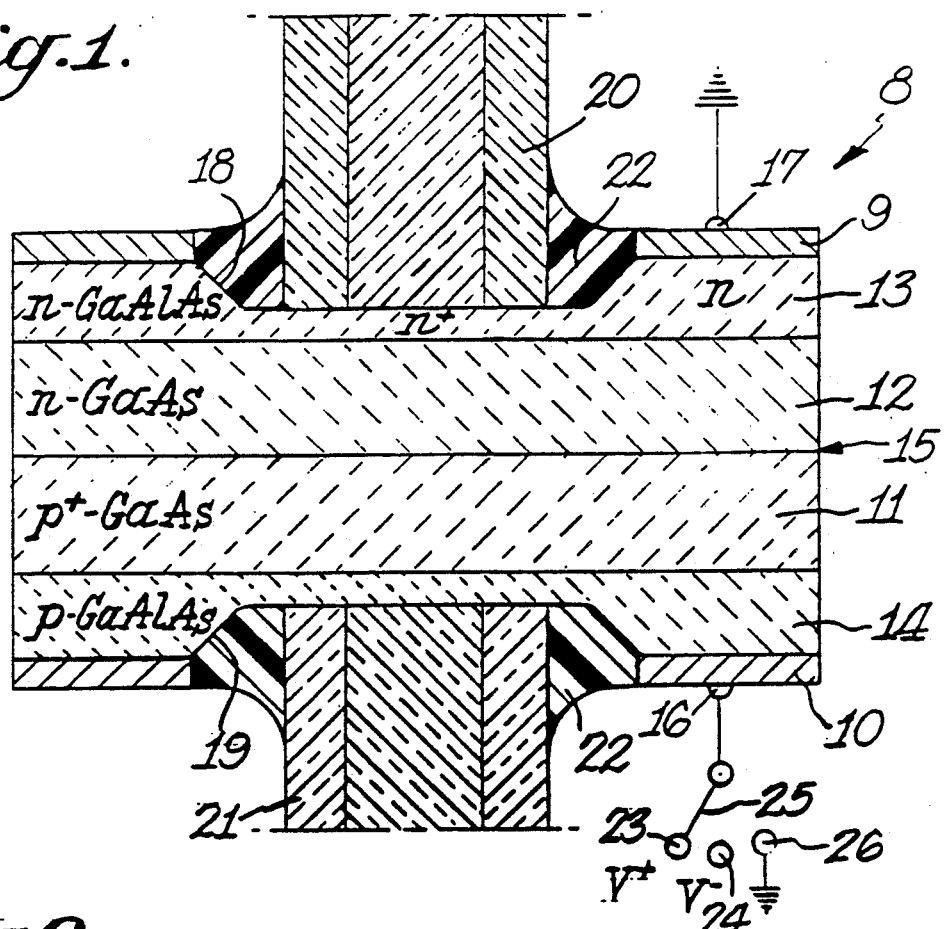

Reference to FIG. 1 provides a description of the basic structure of the instant invention. Shown in the drawing, not to scale, is a cross sectional view of diode 8 with a heavily doped active layer 11 of p-type gallium arsenide (GaAs) of a doping concentration of about $10^{19}$ cm$^{-3}$. Waveguiding layer 12 is lightly doped n-type GaAs, with a doping concentration of $10^{15}$ cm$^{-3}$ to $10^{16}$ cm$^{-3}$. Confining layer 13 of the gallium aluminum arsenide (GaAlAs) is doped for n-type conductivity at a concentration of the order of $10^{18}$ cm$^{-3}$ while layer 14 also GaAlAs is doped p-type at a similar concentration. Reference is made to the description in U.S. Application Serial Number 07/247,042 of the lightly doped n-type layer, also referred to as the waveguiding layer, and of the more highly doped p-type layer, also referred to as the active layer. When the diode is reversed biased for the detecting mode of operation, the hightly doped layer will be mostly depleted. This feature helps the function of the depletion layer in the detection mode.

P-n junction 15 is formed between layers 11 and 12. Metallizations 9 and 10 are provided on the exterior of the layers 13 and 14 respectively. Electrode 16 is applied to metallization 10 and ground contact 17 to metallization 9 for application of voltage for operation as an emitter or detector. Wells 18 and 19 are formed respectively in layers 13 and 14 receiving directly-coupled optical waveguide elements, hereinafter referred to as optical fibers 20 and 21, respectively. The fibers 20 and 21 are secured in the respective wells 18 and 19 by a suitable cement 22. A switch 25 is attached to electrode 16 has a position 23 providing a forward bias for the emitter mode and a position 24 for the receiver mode and a neutral position 26.

This device is particularly advantageous with multi-modecore sized optical fibers, and it is a feature that when the device is quiescent or in the off position 26, a signal will pass through with low loss.

In the diode device of this invention light as referred to herein includes wavelengths in the optical spectrum outside of the narrow band to which the human eye is sensitive i.e. 400 nm to 700 nm. While for the purpose of the description of an embodiment the spectrum associated with gallium arsenide is referred to, it will be readily understood by those skilled in the art that the present invention can be carried out with other semiconducting materials to operate at other ranges of wavelengths. For example with gallium indium arsenide phosphide, it would be effective at longer wavelengths up to 1.7 micrometers.

In the surface-oriented devices of this invention light may be received from either direction normal to the p-n junction and absorbed in the lightly doped n-type wave guiding layer. The resultant detection takes place in the depletion region in this waveguiding layer under reverse biasing. For light emission, a forward bias causes electron injection into the heavily doped p-type active layer leading to recombination in which the electron gives up energy to produce photons. The quantum efficiency is as defined above. The bi-directional operation of the devices of this invention includes an ampfication mode under forward bias. When forward biased with small DC voltage the structure of the present invention amplifies signals fed through from one optical fiber to another. However at the present state of the art using this device as an amplifier may have certain drawbacks.

Figure 2:
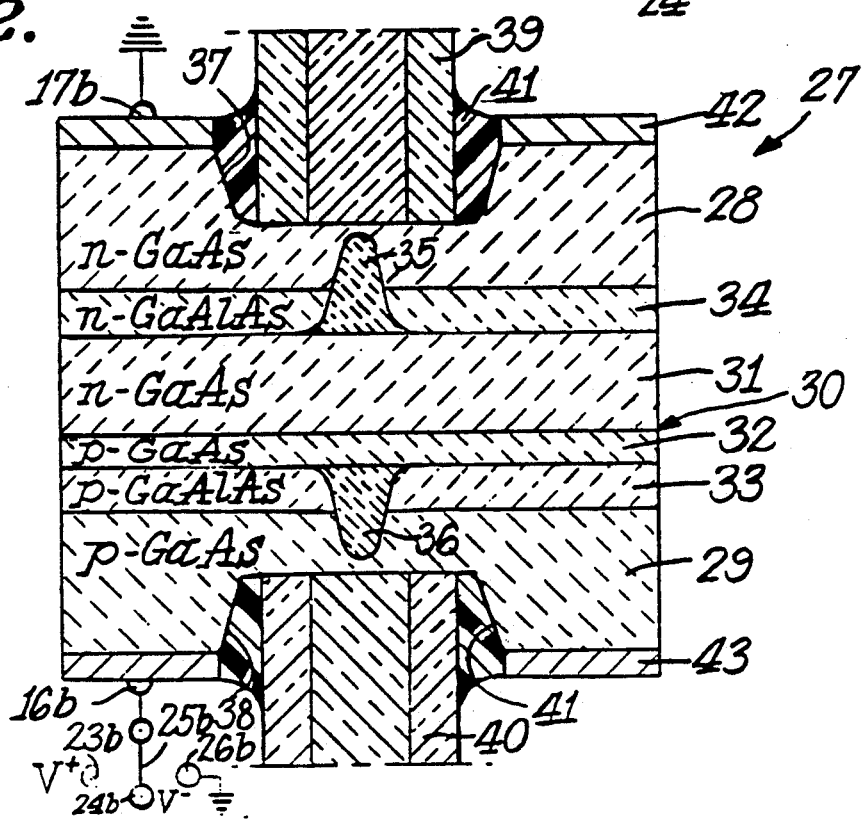
FIG. 2 is a schematic illustration of the preferred embodiment of a diode with two surface-oriented optical fibers secured in wells.
Figure 3:
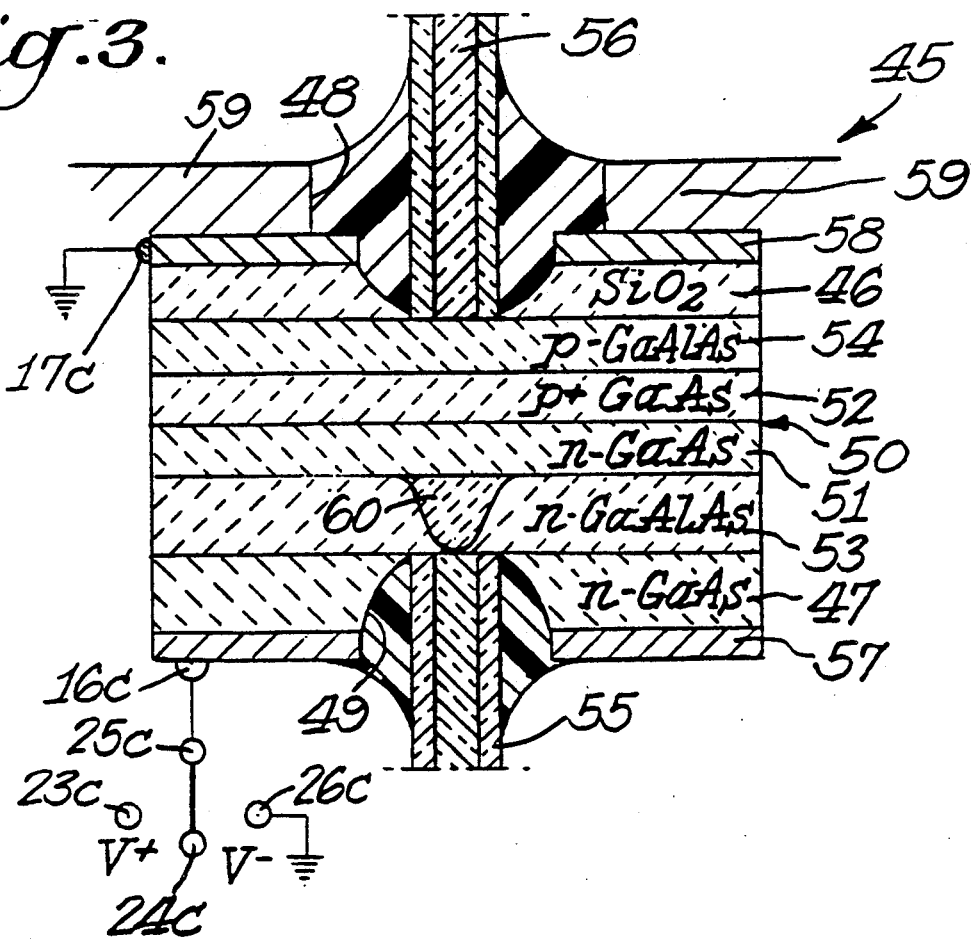
FIG. 3 is a schematic illustration of a modified diode according to this invention having a silicon dioxide support layer.

FIGS. 2 and 3 illustrate structures which are adjusted to improve emission of the light by confining the current to the center of the diode structure.

FIG. 2 illustrates the preferred embodiment of the bidirectional structure 27 which is designed to provide mechanical stability with gallium arsenide layers 28 and 29 to provide strength and low resistance for electrical contact. In the diode 27 a p-n junction 30 is formed between a lightly doped n-type gallium arsenide layer 31 of 1-3 $\mu$m in thickness and a heavily doped p-type gallium arsenide layer 32 of 0.5 $\mu$m in thickness. Adjoining layer 33 is a p-type gallium aluminum arsenide confining layer. An n-type gallium aluminum arsenide confining layer 34 adjoins layer 31 and is 1.0 $\mu$m thick. Layers 33 and 34 are doped with concentrations of $10^{18}$cm$^{-3}$, n-type and p-type respectively. A heavily-doped n region 35 is centrally incorporated in layer 34 and of a diameter of 50-75 $\mu$m. A similar sized heavily-doped p$^+$region 36 may also be added to layer 33. The regions 35 and 36 concentrate the recombination and emission of light centrally of the diode 27 and concentric with wells 37 and 38 formed in the respective support layers 28 and 29. Optical fibers 39 and 40 are surface-oriented in coupling position in the respective wells 37 and 38. The fibers 39 and 40 are secured in their respective wells 37 and 38 by a cement 41. The centrally positioned regions 35 and 36 create easy paths for carriers to follow and accordingly improve the quantum efficiency in the operation of the emitter mode. In this embodiment the wells 37 and 38 have a diameter of from 150 —200 μm. The diode 27 is provided with metallizations 42 and 43 for electrical connections and operation as described above in relation to the structure illustrated FIG. 1. A switch 25B selectively connects positions 23B, 24B and 26B to the diode at electrode 16B. The height of the diode 27 from metallization 42 to metallization 43 is in the range from 150 to 200 μm.

FIG. 3 illustrates a modification of the invention having a diode 45 which has a SiO2 support layer 46 and support layer 47 of n-type gallium arsenide with wells 48 and 49 formed in the respective layers 46 and 47. The diode 45 has a p-n junction 50 formed between a lightly doped n-type layer 51 and a heavily doped p-type layer 52 of gallium arsenide. Confining layers 53 and 54 are respectively n-type conductivity and p-type conductivity gallium aluminum arsenide. Structural strength is provided by the layers 46 and 47, while the windows for light transmission are provided by the wells 48 and 49 in which optical fibers 55 and 56 are arranged so as to be surface-oriented with their axes normal to the plane of the p-n junction 50. The diode 45 is provided with metallizations 57 and 58 for electrical connection and operation through electrode 16C, ground contact 17C, switch 25C and positions 23C, 24C and 26C in the same manner as the switching arrangement described above for FIG. 1.

A region 60 of higher n-type concentration, $10^{19} cm^{-3}$ is centrally positioned in layer 53, which provides increased efficiency of light emission by directing current to the central region of the diode 45. A heat sink 59 is in contact with metallization 58 to dissipate heat and improve the diode's efficiency.

Figure 4:
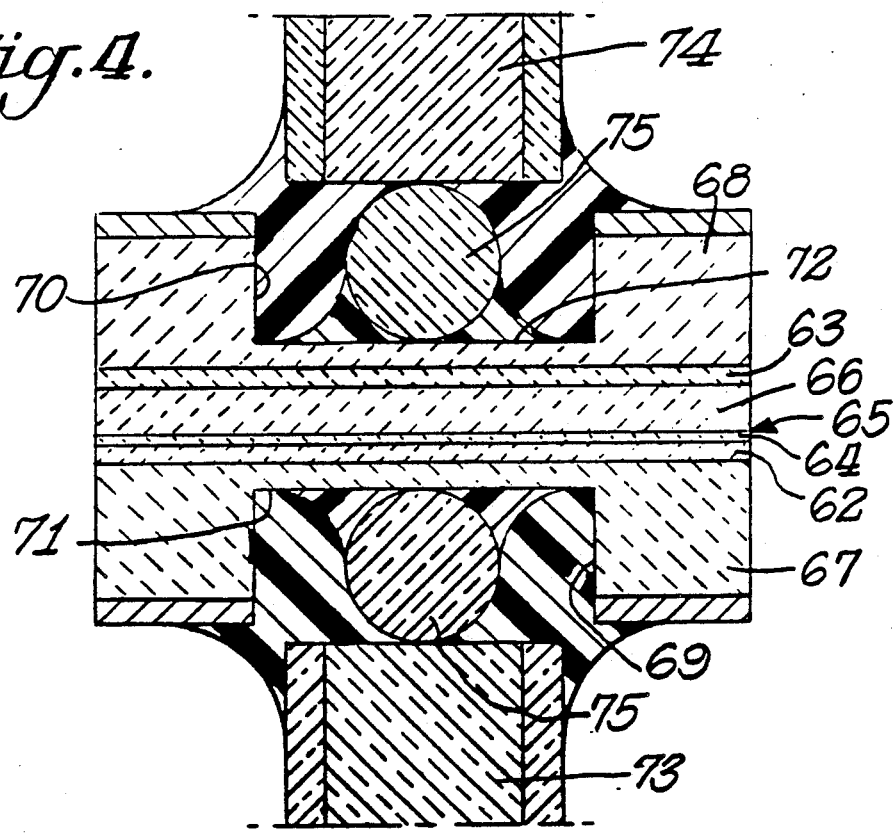
FIG. 4 illustrates a modification of the optical fiber structure at the surface coupling of the fiber and diode.
Figure 5:
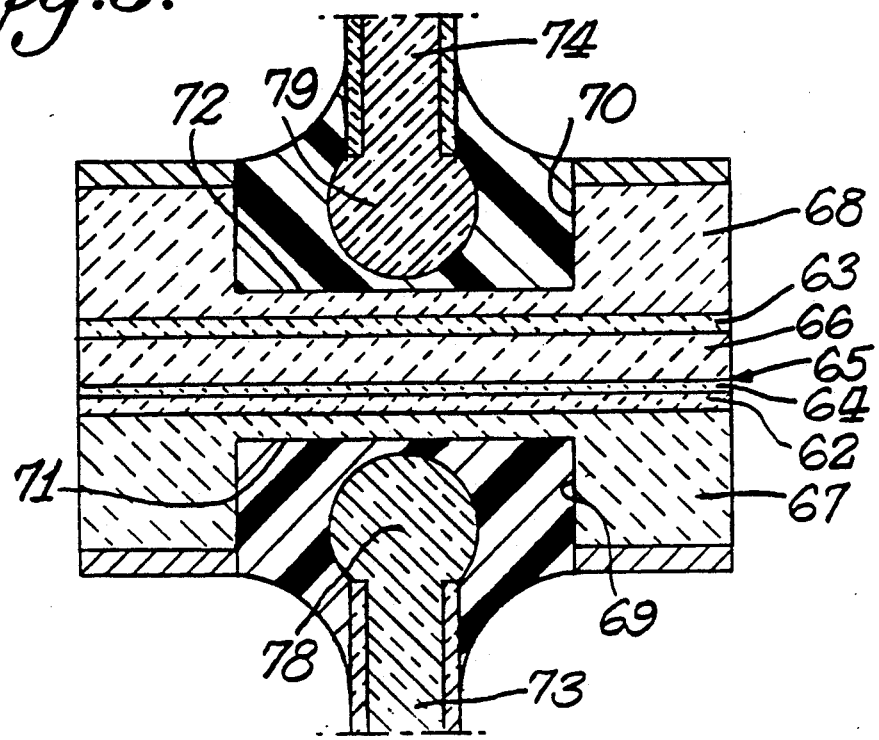
FIG. 5 illustrates another modification of the optical fiber structure at the surface coupling of the fiber and diode.

FIGS. 4 and 5 illustrate other modifications in the unitary emitter-detector diode according to this invention. The modification is provided at the ends of the optical fibers at the diode. In FIG. 4 a spherical lens provides direct coupling between the fiber and the diode at the parallel surface of the diode. In FIG. 5 the tip of the optical fiber is modified. In both FIGS. 4 and 5 a diode 61 has confining layers 62 and 63 of p-type & n-type conductivity respectively a p-type active layer 64 forms a p-n junction 65 with an n-type layer 66. Support layers 67 and 68 are formed with wells 69 and 70 to bring the parallel lateral surfaces 71 and 72 of the wells nearer to the p-n junction 65. Optical fibers 73 and 74 are positioned with their axes normal to the junction 65 at the respective wells 69 and 70 at each side of the diode 61. In the FIG. 4 embodiment the wells 69 and 70 each contain a spherical glass ball lens 75 cemented in the respective well 69 or 70. The fibers 73 and 74 are cemented to the diode 61 so that they terminate at the lenses 75. It will be understood that the transmitted light passing through the fibers 73 and 74 is focussed by passage through the lenses 75 which are of lesser diameter than the fibers 73 and 74. The efficiency of the transmission and coupling is accordingly improved.

In FIG. 5 optical fibers 76 and 77 terminate at the parallel surfaces 71 and 72 in elliptical fiber tips 78 and 79. The tips 78 and 79 are cemented within the wells 69 and 70 with the fiber axes normal to the p-n junction 65 to draw the flow of photons centrally of the diode.

As seen from the preferred embodiment of FIG. 2, the diode 27 provides a reduction in the spread of the current within the diode during its operation. This invention brings the waveguiding means, for example the optical fibers, close to the active volume of the diode and also brings the ends of the fibers close together. Further the diode of this invention guides and concentrates the photon emission within the diode. The effect is exemplified by the illustrated embodiments for example as in FIG. 2, when a forward bias is applied at 23, continuous or pulsed, light is emitted from the active volume. The active volume is defined as the region directly below the optical fiber and is further defined by the diameter of regions 35 and 36. Light from this region is produced by the recombination of electrons from the conduction band with holes in the valence band. This recombination results in the emission of a photon with energy E=hv. Because regions 35 and 36 will reduce the amount of current spreading across diode 27, a large percentage of that photon emission will occur within the active volume, and directly below fiber 39 and 40. Light from this region is emitted in a Lambertian pattern, thus some photons are absorbed within the diode and other photons are simply lost, however, a good approximation of the light coupled into the fiber is given by $$\eta_c = \frac{D_F^2}{D_E^2} (NA)_2$$

where $D_F$ is the diameter of the fiber, $D_E$ is the diameter of the emission region and NA is the numerical aperture of the fiber. Also, shown in FIG. 4 and FIG. 5 are methods for increasing the amount of light coupled into the fiber.

As changes could be made in the above described embodiment of this invention without departing from the scope of the claims, it is intended that the above description is illustrative and having thus described our invention, what we claim as new and desire to secure by Letters Patent of the United States is:

1. A unitary emitter-detector semiconductive diode device with the capability of direct optical coupling at lateral surfaces of the diode device to optical transmission lines, the device having means for coupling to electrical forward bias, and electrical reverse bias between an optical emitter mode, and an optical detector mode and contact means for coupling to external electrical circuits, having in combination a heavily doped semiconductor active layer of one conductivity type, one surface of said active layer forming a p-n junction with one surface of a coextensive lightly doped semiconducting layer of conductivity opposite to that of the active layer;

a first confining layer having a surface in contact with another surface of said active heavily doped semiconducting layer a second confining layer having a surface in contact with another surface of said lightly doped semiconducting layer a first optical waveguide coupled to the lateral surface of the first confining layer, and a second optical waveguide coupled to the lateral surface of the second confining layer to transmit in both directions by direct coupling from lateral surfaces of said device
and indentations formed in opposing surfaces of said diode, said optical waveguides being respectively positioned in said indentations.

2. A unitary emitter-detector semi-conductive diode device as claimed in claim 1 having a support layer adjoining each of said first and second confining layers, the indentations formed in said opposing surfaces being centrally formed in said support layers to provide a thin layer in each support layer between the indentation and the adjoining confining layer.

3. A unitary emitter-detector semiconductive diode device as claimed in claim 1 having a support layer of gallium arsenide outermost from the other layers.

4. A unitary emitting-detector semiconductive diode device as claimed in claim 1 wherein said optical waveguides are first and second optical fibers.

5. A unitary emitter-detector semiconductive diode device as claimed in claim 4 wherein said first confining layer has a region of higher conductivity than said first confining layer, said region being of lesser diameter than said first optical fiber.

6. A unitary emitter-detector semiconductive diode device with the capability of direct optical coupling at lateral surfaces of the diode device to optical transmission lines for transmitting photons,
   the device having means for coupling to electrical forward bias, electrical reverse bias and absence of bias for selection between an optical emitter mode, and optical detector mode and a quiescent mode, and contact mean for coupling to external electrical circuits, having a combination
   a heavily doped semiconductor active layer of one conductivity type,
   one surface of said active layer forming a p-n junction with one surface of a coextensive lightly doped semiconducting layer of a conductivity opposite to that of the active layer;
   a first confining layer having a surface in contact with another surface of said active heavily doped semiconducting layer,
   a second confining layer having a surface in contact with another surface of said lightly doped semiconducting layer,
   a first optical waveguide for transmitting photons coupled to the lateral surfaces of the first confining layer,
   a second optical waveguide coupled to the lateral surface of the second confining layer with its axis normal to the junction to transmit in both directions by direct coupling from lateral surfaces of said device,
   and means on opposite side of said p-n junction for guiding and concentrating the recombination of carriers within the diode.

7. A unitary emitter-detector diode as claimed in claim 6 having in the first confining layer a region of higher conductivity than the conductivity of said first confining layer.

8. A unitary emitter-detector diode device as claimed in claim 7 having said region of higher conductivity than the conductivity of said confining layer centrally positioned in said diode and coaxial with the optical fibers.

9. A unitary emitter-detector semiconductive diode device as claimed in claim 6 wherein each confining layer has a region of higher conductivity than the confining layer.

10. A unitary emitter-detector diode device as claimed in claim 6 wherein said first and second optical waveguides are first and second optical fibers.

11. A unitary emitter-detector semi-conductive device as claimed in claim 10 having in the second confining layer a region of higher conductivity than the conductivity of said second confining layer.

12. A unitary emitter-detector diode as claimed in claim 11 wherein said higher conductivity region has a diameter less than the diameter of the second optical fiber.

13. A unitary emitter-detector semiconductive diode device with the capability of direct optical coupling to optical transmission lines,
   the device having means for coupling to electrical forward bias, electrical reverse bias and absence of bias for selection between an optical emitter mode, an optical detector mode and a quiescent mode, and contact means for coupling to external electrical circuits, having in combination
   a heavily doped semiconductor active layer of one conductivity type having a thickness of 0.5 $\mu$m,
   one surface of said active layer forming a p-n junction with one surface of a coextensive lightly doped semiconducting layer of conductivity opposite to that of the active layer having a thickness of 1-3 $\mu$m,
   a first confining layer having a surface in contact with another surface of said active heavily doped semiconducting layer and having a thickness of 1 $\mu$m,
   a second confining layer having a surface in contact with another surface of said lightly doped semiconducting layer having a thickness of 1 $\mu$m,
   a first optical fiber coupled to a surface of the diode,
   and a second optical fiber coupled to a surface of the diode, said fibers having a diameter of the order of 50 $\mu$m,
   and indentations formed in opposing surfaces of said diode, said optical fibers being respectively positioned in said indentations.

* * * * *